(12) United States Patent
Ok et al.

(10) Patent No.: US 11,711,989 B2
(45) Date of Patent: Jul. 25, 2023

(54) PHASE CHANGE MEMORY

(71) Applicant: INTERNATIONAL BUSINESS MACHINES CORPORATION, Armonk, NY (US)

(72) Inventors: Injo Ok, Loudonville, NY (US); Alexander Reznicek, Troy, NY (US); Soon-Cheon Seo, Glenmont, NY (US); Youngseok Kim, Upper Saddle River, NJ (US); Timothy Mathew Philip, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 94 days.

(21) Appl. No.: 17/209,932

(22) Filed: Mar. 23, 2021

(65) Prior Publication Data
US 2022/0310911 A1 Sep. 29, 2022

(51) Int. Cl.
*H10N 70/00* (2023.01)
*H10N 70/20* (2023.01)

(52) U.S. Cl.
CPC ....... *H10N 70/8413* (2023.02); *H10N 70/063* (2023.02); *H10N 70/231* (2023.02)

(58) Field of Classification Search
CPC .................................................. H01L 45/126
See application file for complete search history.

(56) References Cited

U.S. PATENT DOCUMENTS

| | | | |
|---|---|---|---|
| 7,238,959 B2 | 7/2007 | Chen | |
| 7,659,534 B2 | 2/2010 | Chen | |
| 8,106,376 B2 | 1/2012 | Lai | |
| 8,212,231 B2 | 7/2012 | Chen | |
| 8,288,750 B2 | 10/2012 | Shen | |
| 9,136,128 B2 | 9/2015 | Lee | |
| 9,660,188 B2 | 5/2017 | Lin | |
| 10,050,194 B1 | 8/2018 | Nardi | |
| 2009/0033360 A1* | 2/2009 | Chen | H10N 70/253 438/102 |
| 2010/0270527 A1 | 10/2010 | Sawamura | |
| 2015/0207068 A1 | 7/2015 | Cho | |
| 2018/0205017 A1 | 7/2018 | Bruce | |
| 2019/0157551 A1* | 5/2019 | Lin | H01L 45/06 |
| 2020/0066585 A1* | 2/2020 | Lin | H01L 21/76883 |
| 2021/0376234 A1* | 12/2021 | Heiss | H01L 45/122 |

FOREIGN PATENT DOCUMENTS

| | | |
|---|---|---|
| EP | 1710807 A1 | 10/2006 |
| EP | 1760797 A1 | 3/2007 |
| WO | 2022200145 A1 | 9/2022 |

OTHER PUBLICATIONS

Koelmans et al., "Projected phase-change memory devices", nature Communications, Article, Published Sep. 3, 2015, 7 pages.
Notification of Transmittal of the International Search Report and the Written Opinion of the International Searching Authority, or the Declaration, dated Sep. 9, 2022, International application No. PCT/EP2022/056814, 9 pages.

* cited by examiner

*Primary Examiner* — Mounir S Amer
(74) *Attorney, Agent, or Firm* — L. Jeffrey Kelly

(57) ABSTRACT

An embodiment of the invention may include a semiconductor structure. The semiconductor structure may include a phase change element located above a heater. The heater may include a conductive element surrounding a dielectric element. The dielectric element may include an air gap.

17 Claims, 3 Drawing Sheets

PHASE CHANGE MEMORY

BACKGROUND

The present invention relates to semiconductor devices, and particularly to forming heating elements for phase change materials.

Phase change memory (PCM) devices store data using a phase change material, such as, for example, a chalcogenide alloy, that transforms into a crystalline state or an amorphous state. An electrode may provide a current through the PCM device to produce heat that effectuates phase changes in the PCM between the crystalline and the amorphous phases. Each state of the phase change material has different resistance characteristics. Specifically, the phase change material in the crystalline state has low resistance and the phase change material in the amorphous state has high resistance. In discrete situations, the crystalline state is typically referred to as a "set state" having a logic level "0", and the amorphous state is typically referred to as a "reset state" having a logic level "1". However, in analog computing the state of the PCM may be anywhere from 0 to 1, and may store weights

SUMMARY

An embodiment of the invention may include a semiconductor structure. The semiconductor structure may include a phase change element located above a heater. The heater may include a conductive element surrounding a dielectric element.

An embodiment of the invention may include a semiconductor structure. The semiconductor structure may include a phase change element located above a heater. The heater may include a conductive element surrounding a dielectric element. The dielectric element may include an air gap.

An embodiment of the invention may include a method of forming a semiconductor structure. The method may include conformally depositing a heater liner on Mx+1 dielectric and an Mx contact. The method may include forming a heater dielectric within the heater liner. The heater dielectric may include an air gap. The method may include forming a projection liner above the heater liner. The method may include forming a phase change material above the projection liner.

Figure 1:
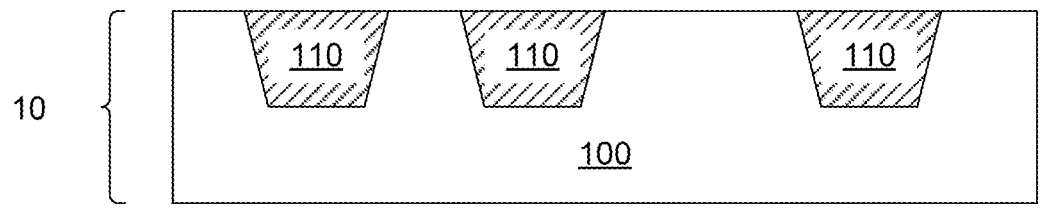
FIG. 1 depicts a cross sectional view of a starting substrate, where the starting substrate has a first conductive layer in an insulator level, according to an exemplary embodiment.

Elements of the figures are not necessarily to scale and are not intended to portray specific parameters of the invention. For clarity and ease of illustration, dimensions of elements may be exaggerated. The detailed description should be consulted for accurate dimensions. The drawings are intended to depict only typical embodiments of the invention, and therefore should not be considered as limiting the scope of the invention. In the drawings, like numbering represents like elements.

DETAILED DESCRIPTION

Exemplary embodiments now will be described more fully herein with reference to the accompanying drawings, in which exemplary embodiments are shown. This disclosure may, however, be embodied in many different forms and should not be construed as limited to the exemplary embodiments set forth herein. Rather, these exemplary embodiments are provided so that this disclosure will be thorough and complete and will convey the scope of this disclosure to those skilled in the art. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements. The term substantially, or substantially similar, refer to instances in which the difference in length, height, or orientation convey no practical difference between the definite recitation (e.g. the phrase sans the substantially similar term), and the substantially similar variations. In one embodiment, substantially similar (and its derivatives such as, for example, about and approximately) denote a difference by a generally accepted engineering or manufacturing tolerance, up to, for example, 10% deviation in value or 10° deviation in angle.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Phase change materials are useful in creating phase change memory for use in semiconductor devices. Such materials have the property that when they undergo a physical change, the resistance of the material changes which allows the material to act as a logical 1 or 0. Such changes may be performed by heating of the material to change the crystalline properties of the material to achieve the change in resistance. In certain embodiments of the current invention, this heating is performed by a resistive heating element located beneath phase change material. The resistive heating element may use a dielectric core having a lower heat capacity than the surrounding conductive elements that perform resistive heating. This may enable a memory cell containing the phase change memory and heater that can undergo thermal heating at lower voltages.

Referring to FIG. 1, $M_x$ level 10 contains an $M_x$ dielectric 100 and $M_x$ conductive material 110. The $M_x$ dielectric 100 may include any suitable dielectric material, for example, silicon oxide, silicon nitride, hydrogenated silicon carbon oxide, silicon based low-k dielectrics, or porous dielectrics. Known suitable deposition techniques, such as, for example, atomic layer deposition (ALD), chemical vapor deposition (CVD), plasma enhanced chemical vapor deposition, spin on deposition, or physical vapor deposition (PVD) may be used to form the $M_x$ dielectric 100. The $M_x$ dielectric 100 may have a thickness ranging from approximately 100 nm to approximately 500 nm and ranges there between, although a thickness less than 100 nm and greater than 500 nm may be acceptable.

With continued reference to FIG. 1, the $M_x$ conductive material 110 may be, for example, a typical line, via, or wire found in a typical interconnect structure. The $M_x$ conductive material 110 may be made of a conductive interconnect material including, for example, copper, aluminum, or tungsten. The conductive interconnect material may be formed using a filling technique such as electroplating, electroless plating, chemical vapor deposition, physical vapor deposition or a combination of methods. The conductive interconnect material may further include a dopant, such as, for example, manganese, magnesium, copper, aluminum, or other known dopants. In some embodiments, various barriers or liners (not shown) may be formed in the $M_x$ level 10 between the $M_x$ conductive material 110 and the $M_x$ dielectric 100. In one embodiment, a liner may include, for example, a tantalum nitride layer, followed by a tantalum layer. Other barrier liners may include cobalt or ruthenium, either alone or in combination with any other suitable liner. In some embodiments, $M_x$ conductive material 110 may be a line or a via.

Figure 2:
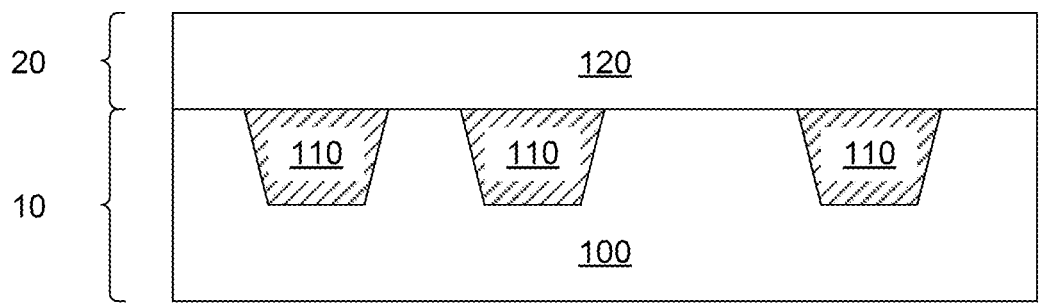
FIG. 2 depicts a cross sectional view of following depositing a second insulator level, according to an exemplary embodiment.

Referring to FIG. 2, $M_{x+1}$ level 20 may be formed containing an $M_x$ dielectric 120. The $M_{x+1}$ dielectric 120 may include any suitable dielectric material, for example, silicon oxide, silicon nitride, hydrogenated silicon carbon oxide, silicon based low-k dielectrics, or porous dielectrics. Known suitable deposition techniques, such as, for example, atomic layer deposition (ALD), chemical vapor deposition (CVD), plasma enhanced chemical vapor deposition, spin on deposition, or physical vapor deposition (PVD) may be used to form the $M_x$ dielectric 100. The $M_{x+1}$ dielectric 120 may each have a thickness ranging from approximately 100 nm to approximately 150 nm and ranges there between, although a thickness less than 100 nm and greater than 150 nm may be acceptable.

Figure 3:
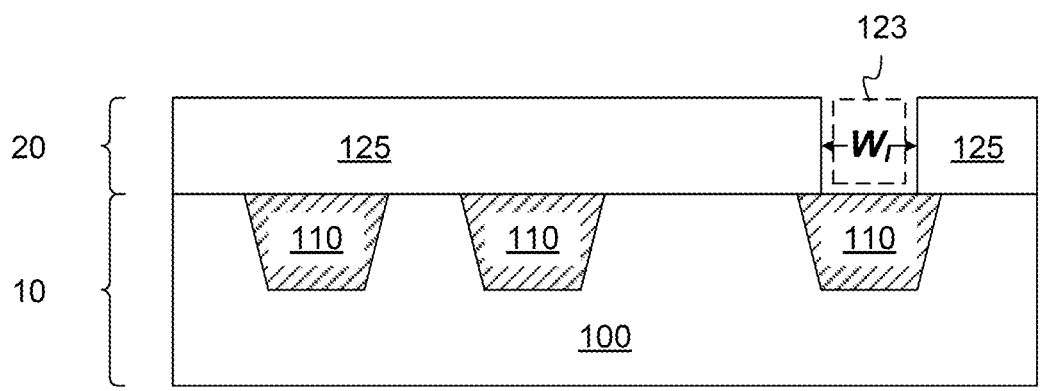
FIG. 3 depicts a cross sectional view of following removing a portion of the second insulator level above the first conductive layer, according to an exemplary embodiment.

Referring to FIG. 3, a trench 123 may be formed in the $M_{x+1}$ dielectric 120 using typical etching techniques, including, for example, the removal of the dielectric may be performed by patterning a lithographic mask above $M_{x+1}$ dielectric 120, and performing an anisotropic etch, such as a RIE etch, to remove the material below the unpatterned portion of the lithographic mask. In some embodiments, including the depicted embodiment, the trench 230 extends through the $M_{x+1}$ levelhea 20 exposing $M_x$ conductive material 110 of the $M_x$ level 10. The trench 123 may be formed such that the width of the opening, $W_T$, is about 10 nm to about 50 nm, and more preferably about 28 nm to about 40 nm.

Figure 4:
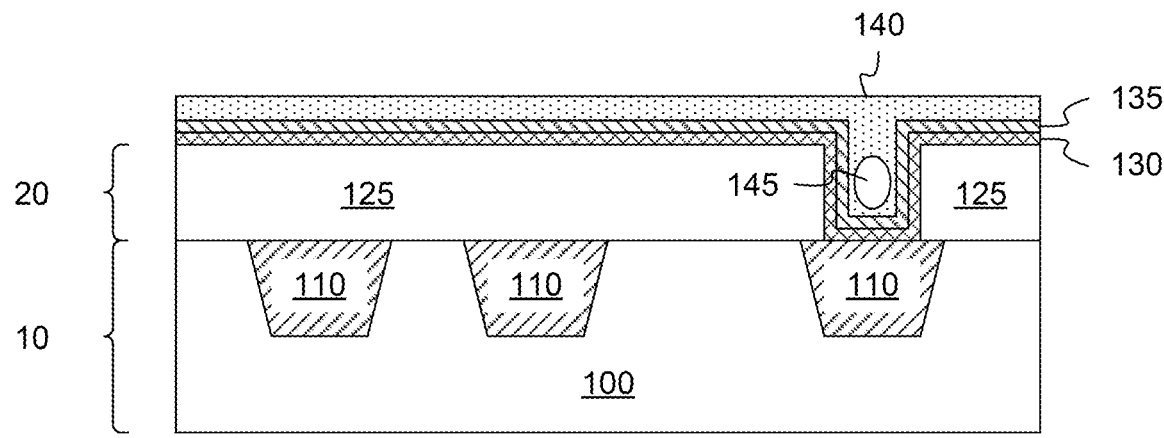
FIG. 4 depicts a cross sectional view following forming a heater by depositing a first conductive liner, a second conductive liner, and an insulator with an air gap above the first conductive layer, according to an exemplary embodiment.

Referring to FIG. 4, a first heater liner layer 130, a second heater liner layer 135, and a dielectric layer 140 may be deposited. The first heater liner layer 130 may include, for example, TaN, SiN, and any other metal nitride having proper resistivity. The first heater liner layer 130 may have a thickness of about 13 to about 10 nm. The first heater liner layer 130 may be formed using any suitable metal deposition technique, including, for example, CVD, PVD, and ALD, sputtering, and plating.

The second heater liner layer 135 may include any metal or metal nitride such as, for example, TiN, graphene, TaN, W, Cu, Ru, Au, and Pt. The second heater liner layer 135 may be selected so that the resistance is 0.05 to 0.5 times the about 250 kOhm/cm$^2$ of the first heater liner layer 130. The second heater liner layer 135 may have a thickness of about 2 to about 20 nm. The second heater liner layer 135 may be formed using any suitable metal deposition technique, including, for example, CVD, PVD, and ALD, sputtering, and plating.

The dielectric layer 140 may include, for example, SiN, SiO2, SiCxOy, TaN, and high resistance metal nitride. Formation of the dielectric layer 140 may result in the formation of void 145 (also referred to as an air gap). The dielectric layer 140 may include any suitable dielectric material, for example, silicon oxide, silicon nitride, hydrogenated silicon carbon oxide, silicon based low-k dielectrics, or porous dielectrics. Known suitable deposition techniques, such as, for example, atomic layer deposition (ALD), chemical vapor deposition (CVD), plasma enhanced chemical vapor deposition, spin on deposition, or physical vapor deposition (PVD). The void 145 may be at least 0.1% of the total volume of dielectric located in the $M_{x+1}$ level 20. Introduction of the void may decrease the amount of resistive heating required by the heater of the memory element to achieve a required temperature for programming the memory element.

Figure 5:
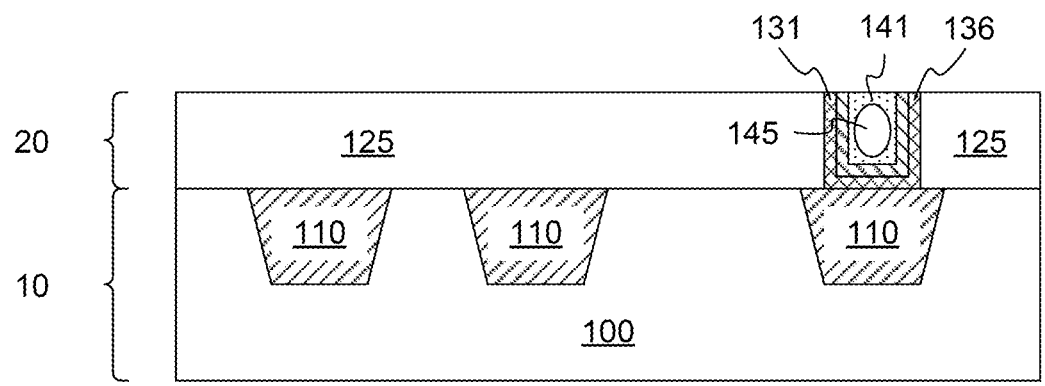
FIG. 5 depicts a cross sectional view following CMP, according to an exemplary embodiment.

Referring to FIG. 5, the first heater liner layer 130, the second heater liner layer 135, and the dielectric layer 140 deposited in FIG. 4 may be recessed to the top of the $M_{x+1}$ dielectric 120, forming first heater liner 131, second heater liner 136, and internal heater dielectric 141.

Figure 6:
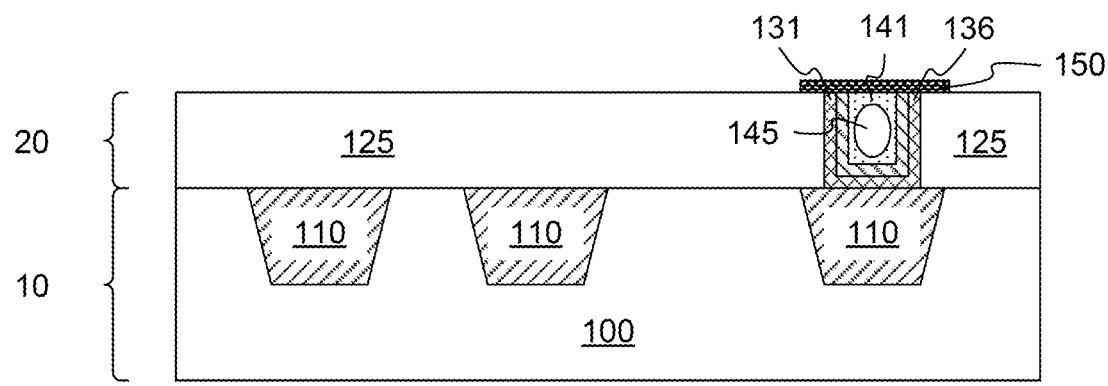
FIG. 6 depicts a cross sectional view following forming a bottom liner above the heater, according to an exemplary embodiment.

Referring to FIG. 6, a bottom liner 150 of the phase change memory cell may be formed. The bottom liner 150 may be formed using any suitable metal deposition technique, including, for example, CVD, PVD, and ALD, sputtering, and plating, and then patterned using any suitable photolithographic and etching techniques. The bottom liner 150 may include, for example, TaN.

Figure 7:
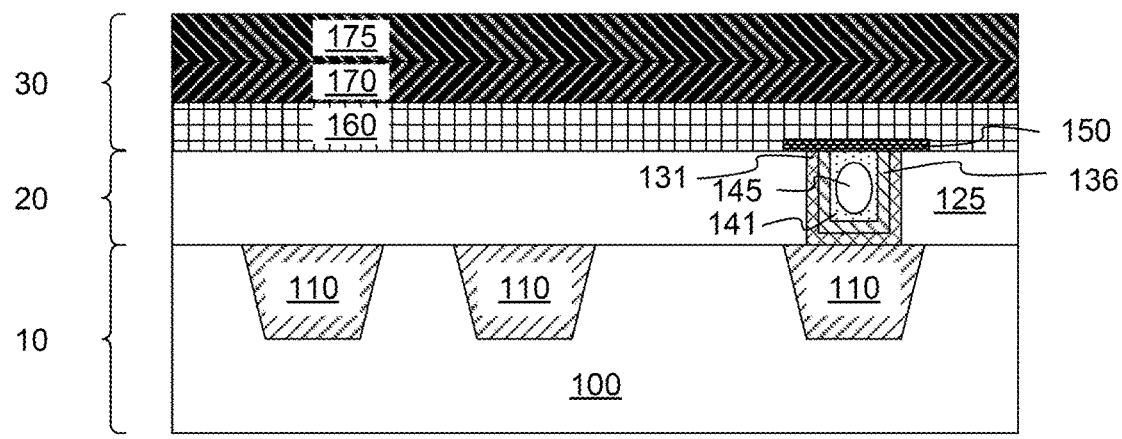
FIG. 7 depicts a cross sectional view following depositing layers of a phase change memory above the bottom liner, according to an exemplary embodiment.

Referring to FIG. 7, a phase change material layer 160, a top contact layer 170 and a hardmask layer 175 may be formed in an $M_{x+2}$ level 30 following the formation of the top portion of the bottom liner 150. The phase change material 160 is formed in electrical communication with the top portion of the bottom liner 150. In one embodiment, the phase change material 160 is formed in direct physical contact with the top portion of the bottom liner 150. In another embodiment, the phase change material 160 may be formed overlying the top portion of the bottom liner 150, wherein an interface layer, such as a diffusion barrier may be positioned between the phase change material 160 and the top portion of the bottom liner 150.

The thickness of the phase change material 160 may range from about 5 nm to about 400 nm. The deposition of the phase change material 160 may include blanket deposition followed by planarization, forming a phase change layer. In a following process step, a portion of the phase change layer is removed to provide phase change material 160. In one embodiment, following formation of a photoresist mask, the exposed portions of the phase change layer are etched using an anisotropic etch process, e.g., reactive ion etching.

In one embodiment, the phase change material 160 may be switched from an amorphous phase to a crystalline phase. When in an amorphous state, the phase change material 160 exhibits a high resistivity. In one embodiment, the amorphous resistivity may range from $10^2$ ohm-m to $10^4$ ohm-m. When in a crystalline state, the phase change material 160 is more conductive, typically exhibiting a lower resistivity by a factor of 10-10000. The phase change material 160 may include chalcogenide alloys. The term "chalcogenide" is used herein to denote an alloy or compound material, which contains at least one element from Group VI of the Periodic Table of Elements. Illustrative examples of chalcogenide alloys that can be employed herein include, but are not limited to, alloys of Te or Se with at least one of the elements of Ge, Sb, As, Si. In other embodiments, the phase change material is made of any suitable material including one or more of the elements Te, Ga, In, Se, and S. In one embodiment, the phase change material has a composition of $Ge_2Sb_2Te_5$ (GST). Although chalcogenides are a group of materials commonly utilized as phase change material, some phase change materials, such as GeSb, do not utilize, chalcogenides. In one embodiment, the layer of the first phase change material is composed of GeSbTe (GST), GeSb, SbTe, GeTe, GeGaSb, SiSbTe, AgInSbTe or a combination thereof. In one embodiment, the phase change material 160 is undoped. The term undoped means that the phase change material is substantially free of dopants and impurities. The term substantially free of dopants and impurities means that dopants are present in less than 1.0 wt %.

Still referring to FIG. 7, the top contact layer 170 may include a metal nitride such as, for example, TiN, TaN, W, W/TiN bilayer, a-C and metal (W, Cu, Pt, Ru) combination, and graphene. The top contact layer 170 may have a thickness of about 10 to about 100 nm. The first heater liner layer 130 may be formed using any suitable metal deposition technique, including, for example, CVD, PVD, and ALD, sputtering, and plating.

Still referring to FIG. 7, the hardmask layer 175 may include a dielectric such as, for example, SiN, a-C, SiOxN, Al2O3, AlN, HfO2, ZrO2. The hardmask layer 175 may have a thickness of about 20 nm to about 200 nm. The hardmask layer 175 may be formed using any suitable metal deposition technique, including, for example, CVD, PVD, and ALD, sputtering, and plating.

Figure 8:
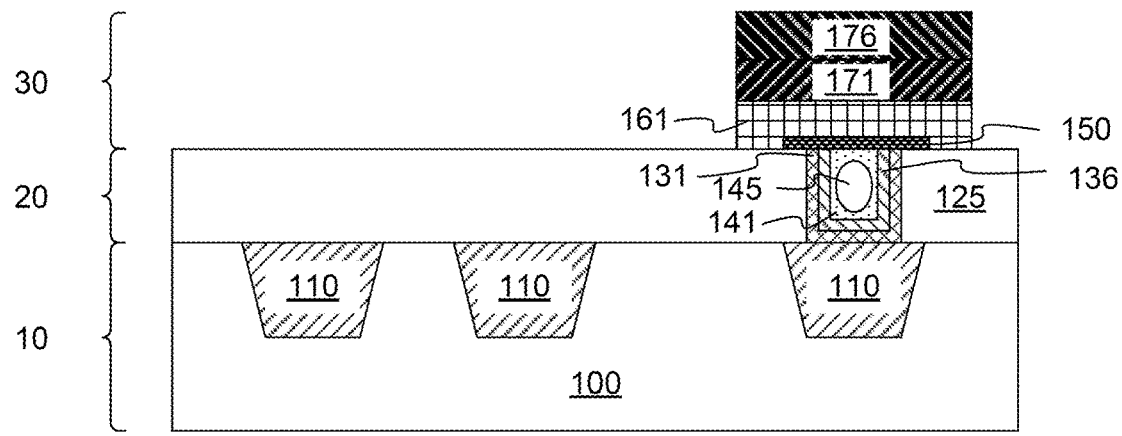
FIG. 8 depicts a cross sectional view following formation of a phase change memory cell, according to an exemplary embodiment.

Referring to FIG. 8, a phase change memory cell including a phase change material 161, a top contact 171, and a top hardmask 176, may be patterned from the phase change material layer 160, the top contact layer 170 and the hardmask layer 175, respectively. Patterning may be accomplished using, for example, photolithographic patterning and an anisotropic etch.

Figure 9:
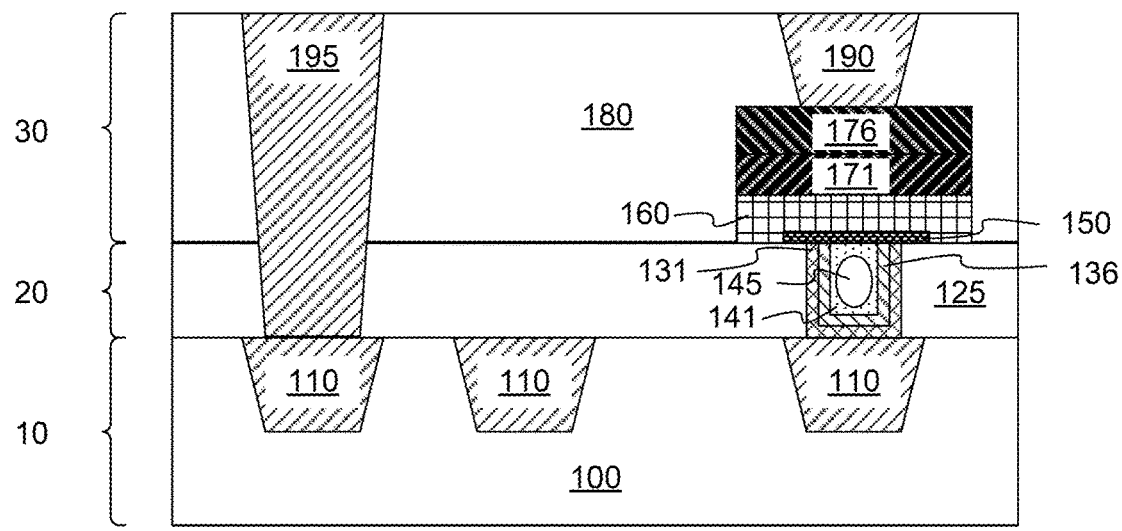
FIG. 9 depicts a cross sectional view following forming connections to phase change memory, according to an exemplary embodiment.

Referring to FIG. 9, an $M_{x+2}$ dielectric 180 may be deposited over the structure, and subsequent damascene or dual damascene structures may be created. The $M_{x+2}$ dielectric 180 may electrically insulate the phase change material 160 from additional interconnect levels (not shown) that may be subsequently formed above the phase change material 160. The $M_{x+2}$ dielectric 180 may be deposited using typical deposition techniques, for example, chemical vapor deposition. The $M_{x+2}$ dielectric 180 may include any suitable dielectric material, for example, silicon nitride ($Si_3N_4$), silicon carbide (SiC), silicon carbon nitride (SiCN), hydrogenated silicon carbide (SiCH), or other known capping materials. The $M_{x+2}$ dielectric 180 may have a thickness ranging from about 50 nm to about 600 nm and ranges there between, although a thickness less than 50 nm and greater than 600 nm may be acceptable.

Still referring to FIG. 9, a damascene opening may be formed in the $M_{x+2}$ dielectric 180. The damascene opening may include a trench opening or two via openings. The damascene opening may be formed using any suitable masking and etching technique known in the art. In one embodiment, a dry etching technique using a fluorine-based etchant, such as, for example $C_xF_y$, may be used. In one embodiment, the depth of the trench opening may range from about 50 nm to about 100 nm. An $M_{x+2}$ conductive material 190, 195 may be fill the void. The $M_{x+2}$ conductive material 190, 195 may include, for example, copper, aluminum, titanium nitride, tantalum nitride or tungsten. The $M_{x+2}$ conductive material 190, 195 may be formed using a filing technique such as electroplating, electroless plating, chemical vapor deposition, physical vapor deposition or a combination of methods.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable other of ordinary skill in the art to understand the embodiments disclosed herein. It is therefore intended that the present invention not be limited to the exact forms and details described and illustrated but fall within the scope of the appended claims.

What is claimed is:

1. A memory structure comprising:
    a phase change element located above a heater: and
    wherein the heater comprises a conductive element surrounding a dielectric element, and
    wherein the dielectric element includes an air gap.

2. The structure of claim 1, wherein the conductive element comprises a first conductive liner and a second conductive liner.

3. The structure of claim 2, wherein the second conductive liner is about 0.05 to about 0.5 times a resistance of the first conductive liner.

4. The structure of claim 1 further comprising a projection liner between the heater and the phase change element.

5. The structure of claim 1, wherein a material of the dielectric element is selected from the group consisting of: SiN, SiO2, and SiCxOy.

6. The structure of claim 1, wherein the air gap comprises at least 0.1% of the volume of a region containing the dielectric element.

7. The structure of claim 2, wherein a material of the first conductive liner is selected from the group consisting of: TaN and SiN.

8. The structure of claim 2, wherein a material of the second conductive liner is selected from the group consisting of: TiN, graphene, TaN, W, Cu, Ru, Au, and Pt.

9. The structure of claim 4, wherein a material of the projection liner is TaN.

10. A memory structure comprising:
a phase change element located on a projection liner above a heater and
wherein the heater comprises a conductive element surrounding a dielectric element, wherein the dielectric element includes an air gap.

11. The structure of claim 10, wherein the conductive element comprises a first conductive liner and a second conductive liner.

12. The structure of claim 11, wherein the second conductive liner is about 0.05 to about 0.5 times a resistance of the first conductive liner.

13. The structure of claim 10, wherein a material of the dielectric element is selected from the group consisting of: SiN, SiO2, and SiCxOy.

14. The structure of claim 10, wherein the air gap comprises at least 0.1% of the volume of a region containing the dielectric element.

15. The structure of claim 11, wherein a material of the first conductive liner is selected from the group consisting of: TaN and SiN.

16. The structure of claim 11, wherein a material of the second conductive liner is selected from the group consisting of: TiN, graphene, TaN, W, Cu, Ru, Au, and Pt.

17. The structure of claim 10 further comprising a projection liner between the heater and the phase change element.

* * * * *